United States Patent [19]

Ogihara

[11] Patent Number: 5,272,672

[45] Date of Patent: Dec. 21, 1993

[54] SEMICONDUCTOR MEMORY DEVICE HAVING REDUNDANT CIRCUIT

[75] Inventor: Masaki Ogihara, Yokohama, Japan

[73] Assignee: Kabushiki Kaisha Toshiba, Kawasaki, Japan

[21] Appl. No.: 748,518

[22] Filed: Aug. 22, 1991

[30] Foreign Application Priority Data

Aug. 23, 1990 [JP] Japan ................ 2-219937

[51] Int. Cl.⁵ ............................................. G11C 13/00
[52] U.S. Cl. ..................................... 365/200; 365/210; 365/233
[58] Field of Search ..................... 365/200, 210, 233

[56] References Cited

U.S. PATENT DOCUMENTS

| 4,951,253 | 8/1990 | Sahara et al. | 365/200 |
| 5,025,418 | 6/1991 | Asoh | 365/200 |
| 5,033,024 | 7/1991 | O'Connell | 365/200 |

FOREIGN PATENT DOCUMENTS 0284102 9/1988 European Pat. Off. .
0333207 9/1989 European Pat. Off. .

OTHER PUBLICATIONS

"A Divided Word-Line Structure in the Static RAM and Its Application to a 64K Full CMOS RAM", IEEE Journal of Solid-State Circuits, vol. SC-18, No. 5, Oct. 1983, pp. 479-485.

"A 256K Dynamic RAM with Page-Nibble Mode", IEEE Journal of Solid-State Circuits, vol. SC-18, No. 5, Oct. 1983, pp. 470-478.

Primary Examiner—Terrell W. Fears
Attorney, Agent, or Firm—Banner, Birch, McKie & Beckett

[57] ABSTRACT

An output of a column redundant circuit is supplied to one spare column selection line. The spare column selection line is provided to select the spare column line. The column redundant circuit includes four spare column decoders of the same number as that of the memory cell arrays which can be selected by the column selection line supplied with an output of a partial column decoder, and an OR gate for deriving the logical sum of outputs of the four spare column decoders and supplying the same to the spare column selection line. An output of the OR gate is supplied to a logic circuit together with an output of the partial column decoder.

6 Claims, 5 Drawing Sheets

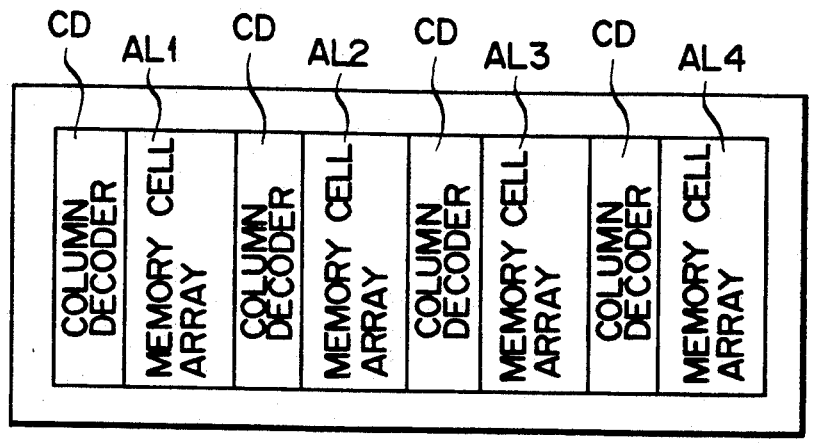
F I G. 1
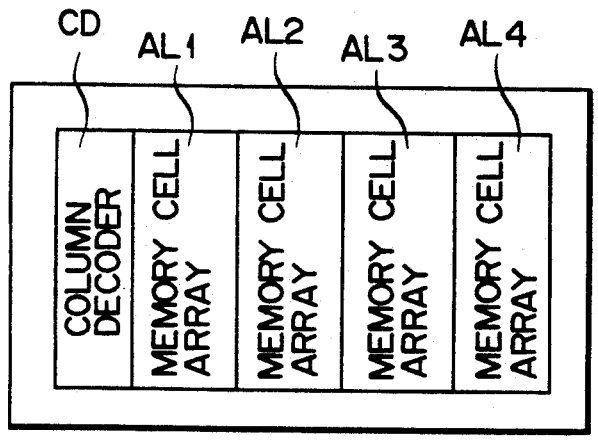
F I G. 2

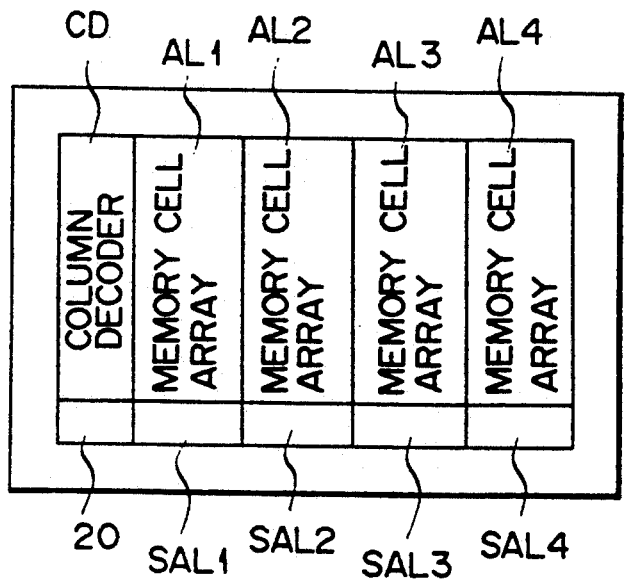
F I G. 4
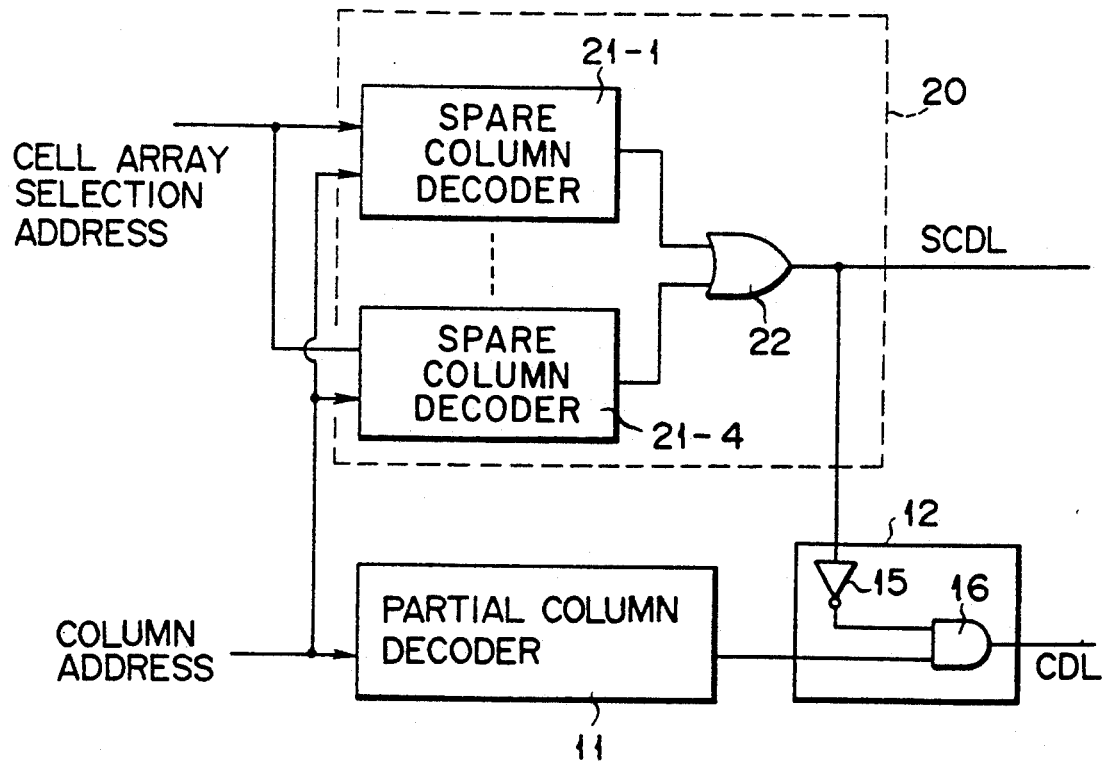
F I G. 5

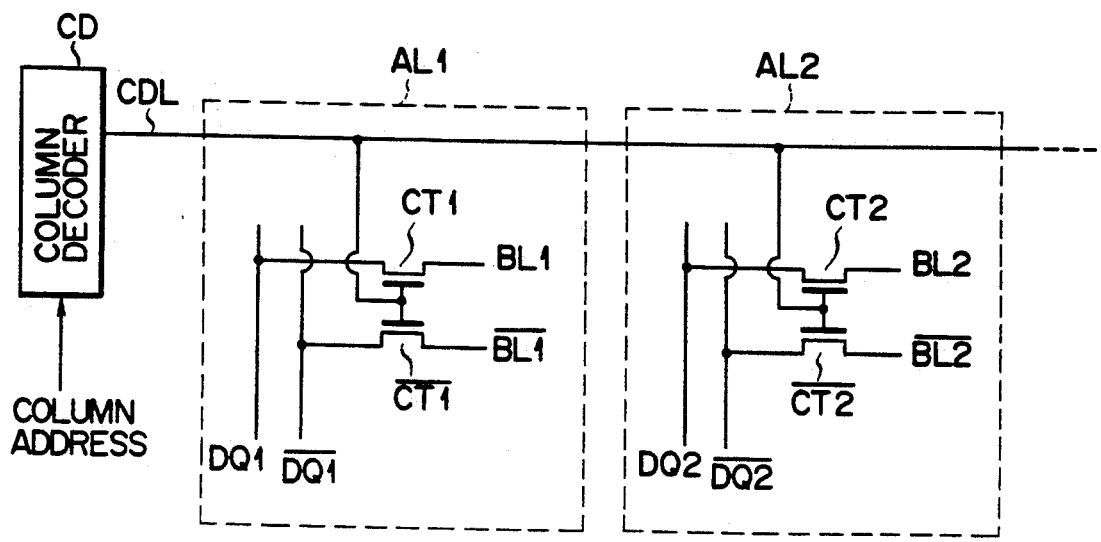
F I G. 6
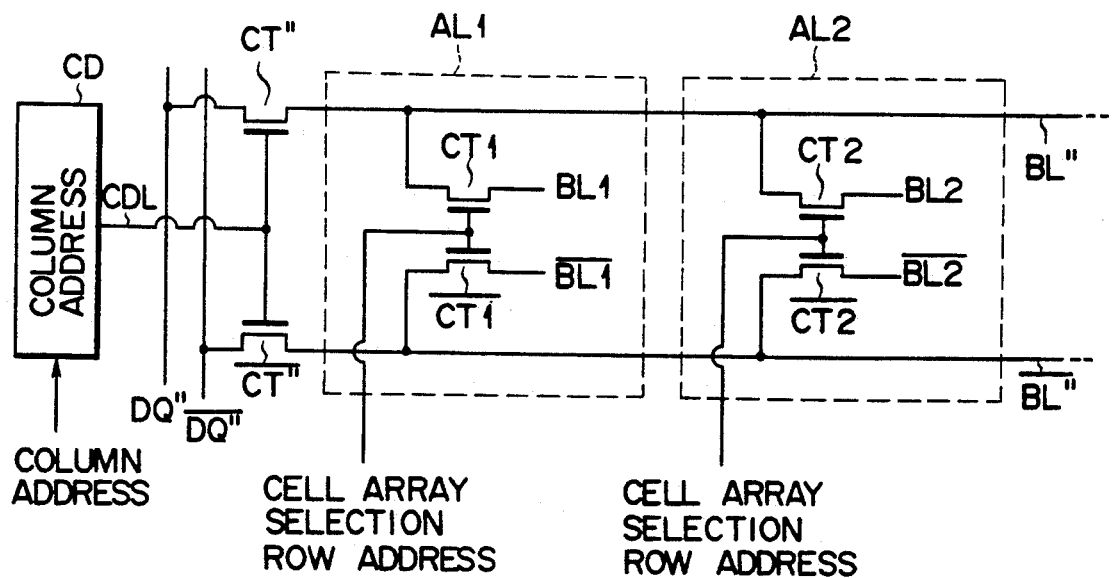
F I G. 7

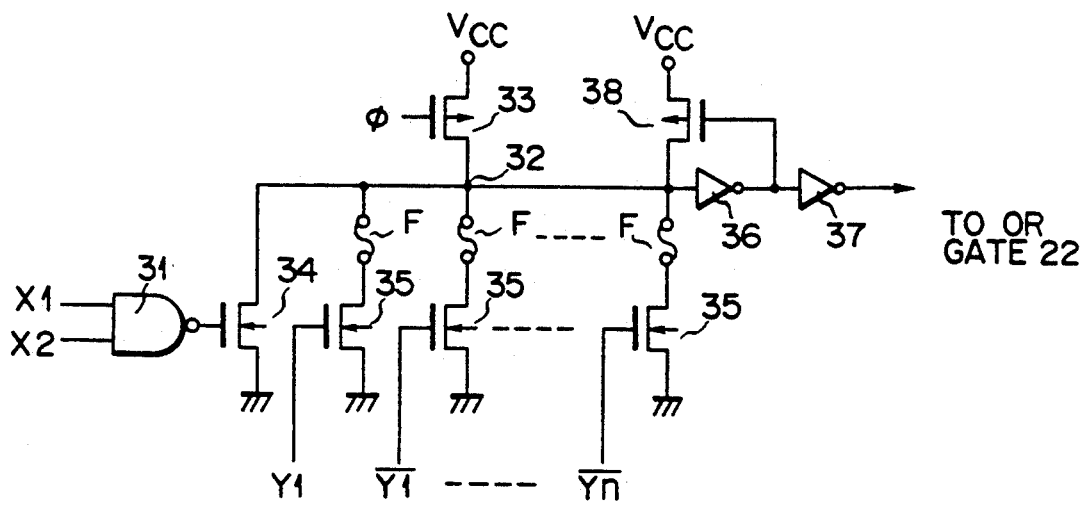
F I G. 8
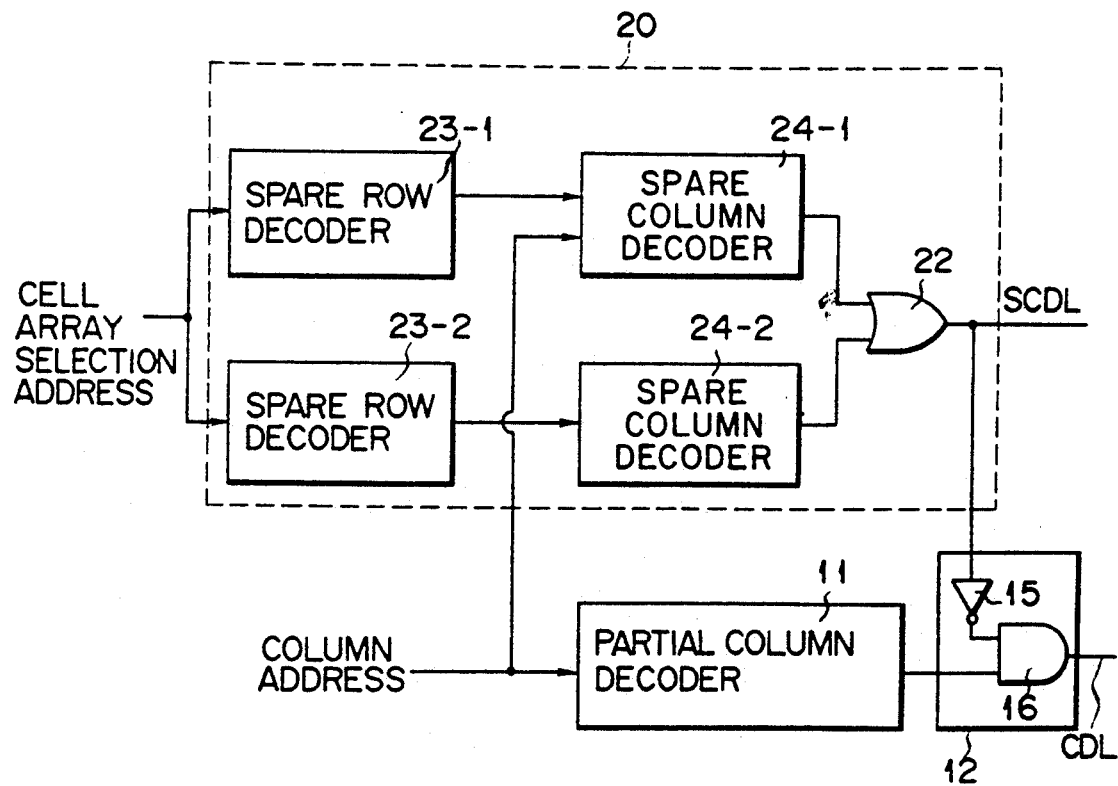
F I G. 9

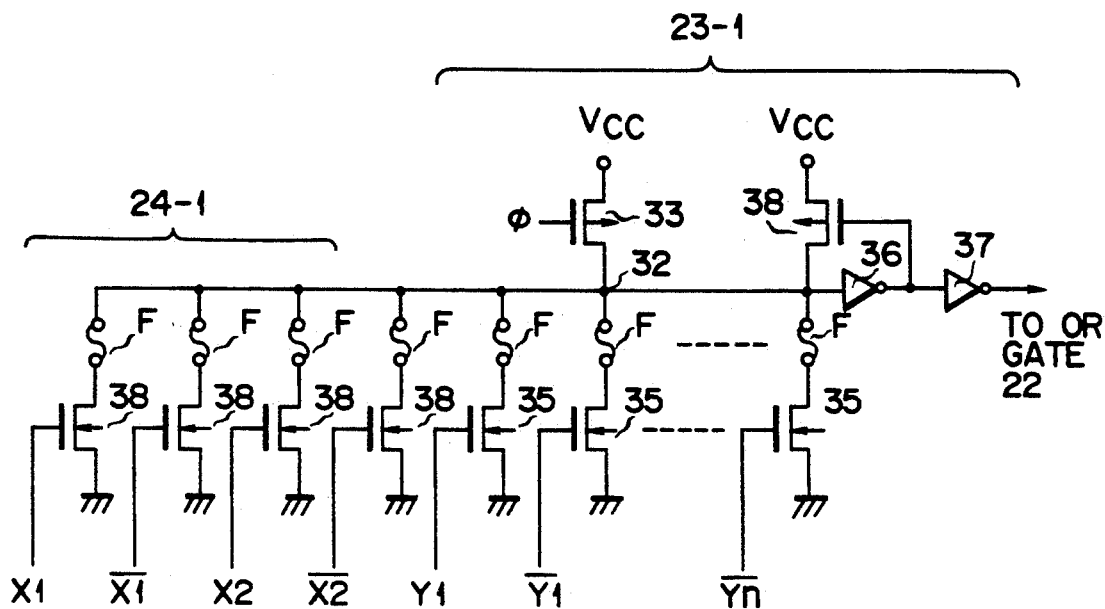
F I G. 10
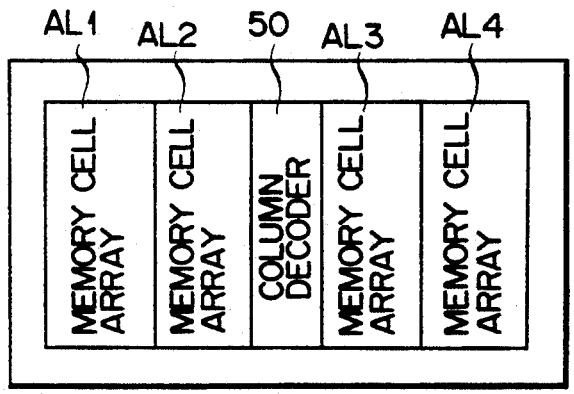
F I G. 11
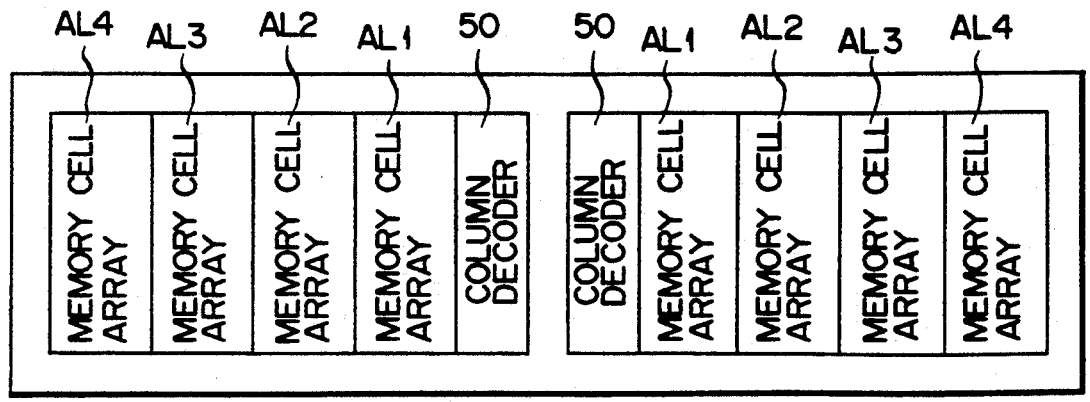
F I G. 12

SEMICONDUCTOR MEMORY DEVICE HAVING REDUNDANT CIRCUIT

BACKGROUND OF THE INVENTION

1. Field of the Invention

This invention relates to a semiconductor memory device, and more particularly to a redundant circuit of a dynamic random access memory (DRAM).

2. Description of the Related Art

In recent years, a chip construction which is designed to permit a circuit to be commonly used by use of a multilayer interconnection is more frequently used with an increase in the memory capacity of the DRAM and an increase in the integration density.

The pattern layout of the chip construction in the conventional DRAM is shown in FIG. 1. That is, memory cells are divided into four memory cell arrays AL1 to AL4 and a column decoder CD and a sense amplifier (not shown) are provided for each of the memory cell arrays AL1 to AL4.

However, when the memory capacity of the memory is increased, the number of divided memory cell arrays must be increased and the chip area will be increased and the integration density cannot be increased if a column decoder CD is provided for each memory cell array in the same manner as in the chip construction shown in FIG. 1. Therefore, a chip construction having a pattern layout whose integration density is enhanced by additionally providing another interconnection layer and collectively disposing the column decoder CD and sense amplifier in one place as shown in FIG. 2 is more frequently used.

A recent DRAM includes a redundant circuit for remedying or compensating a defective chip by replacing defective memory cells of several bits to several thousand bits by spare memory cells which are preparatorily provided. The redundant circuit is a device for replacing a row line or a column line to which the defective memory cells are connected by a spare row line or spare column line provided in the same memory cell array in which the former row line or column line is provided in order to replace the defective memory cells by other memory cells which are provided as spare memory cells.

For example, in the column redundant circuit for replacing column lines, a spare column decoder which has a group of fuse elements and in which a column address can be programmed by cutting off specified fuse elements is provided and a spare memory cell can be selected by selecting the spare column line by use of the spare column decoder without selecting the defective memory cell when a column address corresponding to the defective memory cell is input. Likewise, in the row redundant circuit for replacing row lines, a spare row decoder which has a group of fuse elements and in which a row address can be programmed by cutting off specified fuse elements is provided and a spare memory cell can be selected by selecting the spare row line by use of the spare row decoder without selecting the defective memory cell when a row address corresponding to the defective memory cell is input.

FIG. 3 shows an example of the conventional column redundant circuit. That is, 11 denotes one of a plurality of partial column decoders provided in the column decoder CD, 12 denotes a logic circuit connected to the output side of the partial column decoder 11, and CDL denotes a column selection line supplied with a column selection signal via the logic circuit 12. Further, 13 denotes a column redundant circuit and SCDL denotes a spare column selection line supplied with a spare column selection signal from the column redundant circuit 13. A spare column line (not shown) to which spare memory cells (not shown) are connected is selected by a signal on the spare column selection line SCDL.

In the column redundant circuit 13, 14 denotes a programmable column decoder (spare column decoder) having a fuse element group and receiving a column address. In the spare column decoder 14, fuse elements are previously cut off to activate an output thereof if a defective memory cell is present and when a column address corresponding to the defective memory cell is input.

When a column address corresponding to a normal memory cell is input to the partial column decoder 11, the decoder output is supplied as a column selection signal to the column selection line CDL via the logic circuit 12. At this time, the decoder output from the spare column decoder 14 is set in the non-activated state. In contrast, when a column address corresponding to a defective memory cell is input, the decoder output of the spare column decoder 14 is set into the activated state and supplied as a spare column selection signal to the spare column selection line SCDL, and thus the defective memory cell is substantially replaced by a memory cell connected to the spare column selection line SCDL. Further, an output generated at this time from the spare column decoder 14 is input to the logic circuit 12 to set the output (column selection signal) of the logic circuit 12 into the non-activated state.

The maximum number of memory cells which can be remedied or compensated for by use of the above column redundant circuit is determined according to the number of spare memory cells. However, the number of memory cells which can be actually compensated for is largely dependent on the number of divided memory cell arrays, the number of column decoders, the number of column redundant circuits and the like. The column compensation rates in the chip constructions shown in FIGS. 1 and 2 are compared with each other. In the chip construction shown in FIG. 1, since a column decoder is provided for each memory cell array, a defective column line can be replaced by a spare column line for each memory cell array even when a defective column line is present in each of the memory cell arrays if a column redundant circuit is provided for each of the column decoders of the respective memory cell arrays. That is, when a chip having four column decoders as shown in FIG. 1 is used, one defective column line can be compensated for for each column decoder and four defective column lines at maximum can be compensated for. In contrast, in the chip construction shown in FIG. 2, since only one column decoder is provided and the column decoder simultaneously selects spare column lines with the same column address of the four memory cell arrays, only one defective column line in the four memory cell arrays can be compensated for if one column redundant circuit is provided for the column decoder, and therefore, the compensation rate is reduced to substantially ¼ in comparison with a case of the chip construction shown in FIG. 1.

If four column redundant circuits are provided for each column decoder in the chip construction shown in FIG. 2, for example, in order to enhance the compensation rate, four defective column lines at maximum can be compensated for. In this case, however, four spare column lines must be provided for each memory cell array and a problem that the chip area will be increased occurs.

A problem similar to the above problem occurs when a row redundant circuit is provided in the chip construction in which the integration density is increased by commonly selecting four or more memory cell arrays by use of a single row decoder.

SUMMARY OF THE INVENTION

Accordingly, an object of this invention is to provide a semiconductor memory device capable of enhancing the column compensation rate or row compensation rate while suppressing an increase in the chip area in a case where a column redundant circuit or row redundant circuit is provided in a chip construction in which the integration density is increased by commonly selecting four or more memory cell arrays by use of a single column decoder or row decoder.

According to this invention, there is provided a semiconductor memory device comprising a plurality of memory cell arrays; a plurality of memory cell selection lines commonly provided for the plurality of memory cell arrays; a memory cell selection line selecting circuit for receiving an address and selecting the plurality of memory cell selection lines according to the received address; a spare memory cell selection line used for defective memory cell compensation; and a redundant circuit in which a specified memory cell selection address corresponding to a selection line included in the plurality of memory cell selection lines and associated with a defective memory cell is programmable, and which is designed to receive a memory cell selection address and a memory cell array selection address for selecting one of the plurality of memory cell arrays, and to select the spare memory cell selection line according to the received addresses.

Further, according to this invention, there is provided a semiconductor memory device comprising a plurality of memory cell arrays; a plurality of column selection lines commonly provided for the plurality of memory cell arrays; a column selection circuit for receiving a column address and selecting the plurality of column selection lines according to the received address; a spare column selection line used for defective memory cell compensation; and a redundant circuit in which a specified column address corresponding to a column selection line included in the plurality of column selection lines and associated with a defective memory cell is programmable, and which is designed to receive a column address and a memory cell array selection address for selecting one of the plurality of memory cell arrays, and to select the spare column selection line according to the received addresses.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a diagram showing the pattern layout of a conventional DRAM chip;

FIG. 2 is a diagram showing the pattern layout of a different conventional DRAM chip;

FIG. 4 is a diagram schematically showing the pattern layout of a chip construction according to a first embodiment of a semiconductor memory device of this invention;

FIG. 5 is a block diagram showing an example of a redundant circuit in the device of the first embodiment;

FIG. 6 is a circuit diagram showing a specific construction of a portion near memory cell array and a column decoder in the device of the first embodiment;

FIG. 7 is a circuit diagram showing a specific construction of a portion near memory cell array and a column decoder in the device of the first embodiment;

FIG. 8 is a circuit diagram showing a specific construction of a redundant circuit in the device of the first embodiment;

FIG. 9 is a block diagram showing an example of a redundant circuit according to a second embodiment of a semiconductor memory device of this invention;

FIG. 10 is a circuit diagram showing a specific construction of a redundant circuit in the device of the second embodiment;

FIG. 11 is a diagram schematically showing the pattern layout of a chip of a semiconductor memory device according to a third embodiment of this invention; and FIG. 12 is a diagram schematically showing the pattern layout of a chip of a semiconductor memory device according to a fourth embodiment of this invention.

DETAILED DESCRIPTION OF THE PREFERRED EMBODIMENTS

Figure 3:
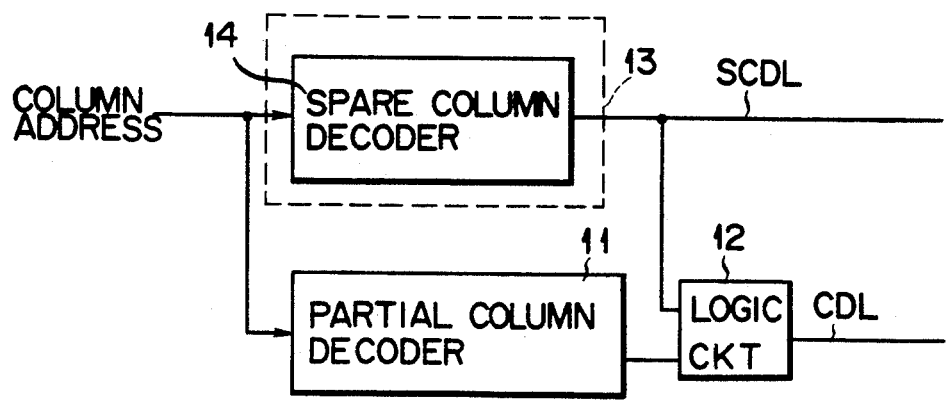
FIG. 3 is a circuit diagram showing an example of a column redundant circuit used in the conventional DRAM.

There will now be described an embodiment of this invention in detail with reference to the accompanying drawings. FIG. 4 is a diagram schematically showing the pattern layout of a DRAM chip according to a first embodiment of this invention and having a redundant circuit provided therein. In the DRAM chip of this embodiment, a chip construction in which column lines of four or more (four in this embodiment) memory cell arrays AL1 to AL4 are commonly selected by a column selection line supplied with a column selection signal output from a single column decoder to enhance the integration density is used. Further, a column redundant circuit for selecting spare column lines (not shown) for defective memory cell compensation provided for the respective memory cell arrays AL1 to AL4 is provided.

That is, a memory cell array is divided into the four memory cell arrays AL1 to AL4, for example. A column decoder CD, a sense amplifier (not shown) and the like are arranged on one end side of the chip. The column decoder CD includes a plurality of partial column decoders commonly used for the four memory cell arrays AL1 to AL4. Further, a column redundant circuit 20 is arranged in position adjacent to the column decoder CD on the one end side of the chip. The column redundant circuit 20 includes a spare column decoder constructed by a programmable address decoder having a fuse element group, and receives an address for memory cell array selection together with a column address and effects the decoding operation. The spare column line is selected by an output of the column redundant circuit 20. SAL1 to SAL4 respectively denote redundant memory cell groups provided in positions adjacent to the memory cell arrays AL1 to AL4, and the redundant memory cell groups SAL1 to SAL4 are connected to the spare column lines.

In this embodiment, memory cells for each of the four memory cell arrays can be remedied or compensated for by use of a single column redundant circuit 20, and the specific construction is shown in FIG. 5.

FIG. 5 shows one partial column decoder 11 and column redundant circuit 20 in the column decoder CD, and 12 denotes a logic circuit connected to the output side of the partial column decoder 11 and an output (column selection signal) of the logic circuit 12 is supplied to the column selection line CDL.

An output (spare column selection signal) of the column redundant circuit 20 is supplied to one spare column selection line SCDL. The spare column selection line SCDL is provided to select the spare column lines.

The column redundant circuit 20 includes four spare column decoders 21-1 to 21-4 of the same number as that of memory cell arrays which can be selected by the column selection line supplied with an output of the partial column decoder 11, and a logic circuit which is an OR gate 22 in this example and derives a logical sum of outputs of the four spare column decoders 21-1 to 21-4 and outputs the logical sum to the spare column selection line SCDL. An output of the OR gate 22 is supplied to the logic circuit 12.

As will be described later, each of the spare column decoders 21-1 to 21-4 includes a fuse element group formed of polysilicon, for example, and receives an address for memory cell array selection, for example, 2-bit row address together with an n-bit column address and decodes the same. That is, in a case where a defective memory cell is present, specified fuse elements of the spare column decoders 21-1 to 21-4 are selectively cut off by use of a laser beam or the like so as to activate an output thereof when an address corresponding to the defective memory cell is input.

The logic circuit 12 includes an inverter 15 for inverting an output of the OR gate 22, for example, and an AND gate 16 supplied with outputs of the inverter 15 and partial column decoder 11.

A single-layered interconnection layer which becomes necessary because the column decoder CD commonly used for the four memory cell arrays AL1 to AL4 is collectively disposed in one place as shown in FIG. 4 can be used according to two circuit arrangements respectively shown in FIGS. 6 and 7. That is, as shown in FIG. 6, in the first circuit arrangement, the additionally provided single-layered interconnection layer is assigned to the column selection line CDL extending from the output terminal of the column decoder CD and the column selection line CDL is commonly provided on the memory cell arrays AL1, AL2, - - - to select column selection transistors CT1, /CT1, CT2, /CT2, - - -. In this case, BL1, /BL1; BL2, /BL2; - - - denote column line pairs of the memory cell arrays AL1, AL2, - - - and DQ1, /DQ1; DQ2, /DQ2; - - - denote common data line pairs of the memory cell arrays AL1, AL2, - - -. Further, the column selection line CDL is provided in parallel with the column line pairs BL1, /BL1; BL2, /BL2; - - - of the memory cell arrays AL1, AL2, - - -.

Further, as shown in FIG. 7, in the second circuit arrangement, the additionally provided single-layered interconnection layer is assigned to the second column line pairs BL", /BL", - - - and the second column line pairs BL", /BL", - - - are commonly provided on the memory cell arrays AL1, AL2, - - - and connected to one-side ends of first column selection transistors CT1, /CT1; CT2, /CT2, - - - of the memory cell arrays AL1, AL2, - - - and connected to one-side ends of second column selection transistors CT", /CT", - - -. The other ends of the second column selection transistors CT", /CT", - - - are commonly connected to common data line pair DQ", /DQ" and the column selection line CDL extending from the output terminal of the column decoder CD is used to select the second column selection transistors CT", /CT", - - -. The first column selection transistors CT1, /CT1; CT2, /CT2; - - - are selected by a memory cell array selection row address. The second paired column lines BL" and /BL" are provided in parallel with the first column line pairs BL1, /BL1; BL2 /BL2; - - - of the memory cell arrays AL1, AL2, - - -.

In the above DRAM, when a column address designating a normal memory cell is input to the column decoder CD, an output of the partial column decoder 11 is supplied as a column selection signal to the column selection line CDL via the logic circuit 12. At this time, even if an address in which only the column address corresponding to a defective memory cell coincides with that for the defective memory cell or only the memory cell array selection address coincides with that for the defective memory cell is input, outputs of the spare column decoders 21-1 to 21-4 are kept in the non-activated state and an output of the OR gate 22 is kept in the non-activated state so that the spare column selection line SCDL will not be selected. In contrast, when an address corresponding to a defective memory cell in a memory cell array is input, one of the outputs of the spare column decoders 21-1 to 21-4 is set into the activated state and supplied as a spare column selection signal to the spare column selection line SCDL via the OR gate 22, thereby permitting the defective memory cell to be replaced by the memory cell connected to the spare column line. Further, a signal lying on the spare column selection line SCDL at this time is input to the logic circuit 12 and the output (column selection signal) of the logic circuit 12 is set into the nonactivated state. In this case, even if an address in which only the column address corresponding to a defective memory cell coincides with that for the defective memory cell or only the memory cell array selection address coincides with that for the defective memory cell is input to part of the spare column decoders 21-1 to 21-4, an output of the part of the spare column decoders is kept in the non-activated state.

According to the DRAM of the above embodiment, there is provided a single column redundant circuit 20 which can select a spare column line to be used instead of a defective memory cell to be compensated independently for each memory cell array by adding an address for selection for each memory cell array. Therefore, the same column remedying or compensating rate as in a case wherein the conventional column redundant circuit is provided for each column decoder of the memory cell array in a chip construction having a column decoder provided for each memory cell array as shown in FIG. 1 can be obtained and an increase in the chip area can be suppressed.

FIG. 8 shows a specific construction of a spare column decoder 21-1 which is one of the spare column decoders 21-1 to 21-4. In FIG. 8, a NAND gate 31 is supplied with X1 and X2 as memory cell array selection row addresses. Further, the NAND gates 31 in the other spare column decoders 21-2 to 21-4 are respectively supplied with /X1 and X2, X1 and /X2, and /X1 and /X2.

Further, the source-drain path of a precharging P-channel MOS transistor 33 is connected between an application node of power source potential VCC and a node 32. The gate of the transistor 33 is supplied with a precharge control pulse signal $\phi$. The source-drain path of an N-channel MOS transistor 34 whose gate is connected to receive an output of the NAND gate 31 is connected between the node 32 and a ground potential terminal. Further, fuse elements F and the respective source-drain paths of a plurality of N-channel MOS transistors 35, - - - are series-connected between the node 32 and the ground potential terminal. The gates of the plurality of MOS transistors 35, 35, - - - are respectively supplied with complementary data Y1 and /Y1, - - -, Yn and /Yn of an n-bit column address.

The node 32 is connected to an input terminal of an inverter 36. The output terminal of the inverter 36 is connected to an output terminal of an inverter 37. An output of the inverter 37 is supplied to the OR gate 22. Further, the source-drain path of a P-channel MOS transistor 38 is connected between the application node of power source potential VCC and the node 32. The gate of the MOS transistor 38 is supplied with an output of the inverter 36.

In the spare column decoder 21-1 with the above construction, if a defective memory cell is present in a corresponding memory cell array AL1, one of the fuse elements F of each pair is cut off to program a column address for the defective memory cell. For example, when a Y1 bit of the column address corresponding to the defective memory cell is "1", the fuse element F which is series-connected with the MOS transistor 35 whose gate is connected to receive /Y1 is cut off.

Assuming now that X1 and X2 of a 2-bit row address are both set at an "H" level, an output of the NAND gate 31 is set to an "L" level to turn off the MOS transistor 34. As a result, the column address decoding operation can be effected by use of only the spare column decoder 21-1. Further, the precharge MOS transistor 33 is previously set into the ON state by the pulse signal $\phi$ and the node 32 is precharged to the "H" level. When the address programmed by the spare column decoder 21-1 coincides with an input column address, all of the MOS transistors 35, 35, - - - are turned off and the potential of the node 32 is maintained at the "H" level which has been set in the precharging operation. At this time, an output of the inverter 36 is set to the "L" level and an output of the inverter 37 is set to the "H" level, thereby driving the spare column selection line SCDL to the "H" level via the OR gate 22. The MOS transistor 38 has a function to maintain the potential of the node 32 at the "H" level eve after the period of precharging by the MOS transistor 33 is terminated and the MOS transistor 33 is turned off.

On the other hand, when the spare column selection line SCDL is driven, an output of the inverter 15 in the logic circuit 12 shown in FIG. 5 is set to the "L" level and an output of the AND gate 16 is also set to the "L" level so that the normal column selection line CDL will not be driven.

FIG. 9 shows the construction of the redundant circuit 20 according to a second embodiment of this invention. In this embodiment, the redundant circuit 20 includes two spare row decoders 23-1 and 23-2 for receiving a memory cell array selection address used for selection of each memory cell array and decoding the same, two spare column decoders 24-1 and 24-2 for receiving outputs of the spare row decoders together with the column address and decoding the same, and an OR gate 22 for deriving a logical sum of the outputs of the spare column decoders 24-1 and 24-2 and supplying the logical sum to the spare column selection line SCDL.

Programmable fuse elements are provided in the spare column decoders 24-1 and 24-2. If a defective memory cell is present in the memory cell arrays AL1 to AL4, specified fuse elements in the spare row decoders 23-1 and 23-2 are previously cut off to activate the outputs thereof when an address necessary for selecting the memory cell array in which the defective memory cell is present is input. Likewise, fuse elements are provided in the spare column decoders 24-1 and 24-2, and specified fuse elements are previously cut off to activate the outputs thereof when the decoder outputs of the spare row decoders 23-1 and 23-2 are set in the selected state and a column address for the defective memory cell is input.

In this case, the number of memory cell arrays selected by the spare row decoder 23-1 or 23-2 is not limited to one, and specified fuse elements may be cut off to decode the upper one bit or lower one bit of a 2-bit row address input to simultaneously select two memory cell arrays. As a result, when defective memory cells are present on the same column addresses of the two memory cell arrays, the remedying or compensating operation for the defective memory cells of the two memory cell arrays can be commonly effected by use of the spare column decoder 24-1 or 24-2.

According to the column redundant circuit 20 shown in FIG. 9, the number of spare column decoders used can be reduced in comparison with the column redundant circuit shown in FIG. 5. That is, in the column redundant circuit shown in FIG. 5, four spare column decoders of the same number as that of memory cell arrays which can be selected by a column selection line to which an output of the column decoder is supplied are required, but in the column redundant circuit shown in FIG. 9, a desired number of spare column decoders which is not larger than the number of memory cell arrays can be used.

FIG. 10 shows the specific construction of the spare row decoder 23-1 and the spare column decoder 24-1 which are respectively used as one of the spare row decoders 23-1 and 23-2 and one of the spare column decoders 24-1 and 24-2 in the embodiment of FIG. 9.

The construction of the spare column decoder 24-1 in this embodiment is equal to that obtained by removing the NAND gate 31 and the N-channel MOS transistor 34 from the spare column decoder shown in FIG. 8, and therefore, the explanation therefor is omitted. The spare column decoder 24-1 is constructed by four fuse elements F and N-channel MOS transistors 38. The four fuse elements F and the source-drain paths of the respective N-channel MOS transistors 38 are series-connected between the node 32 of the spare column decoder 24-1 and the ground potential terminal. Further, the gates of the four MOS transistors 38, 38, - - - are respectively supplied with 2-bit complementary row addresses X1 and /X1; and X2 and /X2 for memory cell array selection.

In this case, in the spare row decoder 23-1, four fuse elements F are selectively cut off to select two memory cell arrays AL1 and AL2, for example. Further, in the spare column decoder 24-1, the fuse elements F are selectively cut off to program a column address corresponding to a defective memory cell.

FIGS. 11 and 12 schematically show the pattern layouts of DRAM chips according to third and fourth embodiments of this invention, and like the former embodiments, this invention can be applied to these embodiments. That is, the pattern layout of FIG. 11 is different from the pattern layout of FIG. 4 in that a column decoder section 50 including a column decoder and a spare column decoder is disposed in the central portion of the pattern layout.

Further, the pattern layout of FIG. 12 includes two pattern layouts which are the same as that shown in FIG. 11.

In all of the above embodiments, the column redundant circuit is provided as the redundant circuit, but it is of course possible to use a row redundant circuit in substantially the same manner as in the above embodiments.

As described above, according to the semiconductor memory device of this invention, in a case where a column redundant circuit or row redundant circuit is provided in a chip construction in which the integration density is enhanced by using one column decoder or row decoder to commonly select a plurality of memory cell arrays, the column compensation rate or row compensation rate can be enhanced while an increase in the chip area is suppressed.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor device comprising:
a plurality of memory cell arrays;
a plurality of memory cell selection lines commonly provided for said plurality of memory cell arrays;
a memory cell selection line selecting circuit for receiving an address and selecting said plurality of memory cell selection lines according to the received address;
a plurality of spare memory cell arrays provided for each memory cell array, and each selected by a memory cell array selection address which is used for selecting said memory cell arrays;
a spare memory cell selection line provided commonly for said plurality of spare memory cell arrays; and
a redundant circuit which is preprogrammed with particular memory cell addresses corresponding to ones of said plurality of memory cell selection lines which are associated with defective memories, and which is designed to receive a memory cell selection address and said memory cell array selection address, and to select said spare memory cell selection line according to the received addresses.

2. A semiconductor memory device comprising:
a plurality of memory cell arrays;
a plurality of column selection lines commonly provided for said plurality of memory cell arrays;
a column selection line selecting circuit for receiving a column address and for selecting said plurality of column selection lines according to the column received address;
a redundant circuit which has been preprogrammed with particular column addresses corresponding to ones of said plurality of column selection lines which are associated with defective memories, and which is designed to receive a column address and said memory cell array selection address and to select said spare column selection line according to the received addresses.

3. A semiconductor memory device according to claim 2, wherein said redundant circuit includes spare column decoders of the same number as that of said memory cell arrays, receiving a column address and a memory cell array selection address and decoding the same; and a logic circuit for deriving a logical sum of outputs of said plurality of spare column decoders and supplying the logical sum to said spare column selection line.

4. A semiconductor memory device according to claim 2, wherein said redundant circuit includes a plurality of spare row decoders for receiving the memory cell array selection address and decoding the same; a plurality of spare column decoders for receiving decoder outputs of said spare row decoders and the column address and decoding the same; and a logic circuit for deriving the logical sum of outputs of said spare column decoders and supplying the logical sum to said spare column selection line.

5. A semiconductor memory device according to claim 2, wherein said column selection lines are commonly formed on said plurality of memory cell arrays and arranged in parallel with column lines of said memory cell arrays to select said column lines.

6. A semiconductor memory device according to claim 2, wherein said column selection lines are commonly formed on said plurality of memory cell arrays to select second column lines which are arranged in parallel with first column lines of said memory cell arrays.

* * * * *